United States Patent [19]

Thenoz et al.

[11] Patent Number: 4,997,784
[45] Date of Patent: Mar. 5, 1991

[54] FABRICATION METHOD FOR A CCD FRAME TRANSFER PHOTOSENSITIVE MATRIX WITH VERTICAL ANTI-BLOOMING SYSTEM

[75] Inventors: Yves Thenoz; Francois Roy, both of Grenoble, France

[73] Assignee: Thomson-CSF, Puteaux, France

[21] Appl. No.: 471,418

[22] Filed: Jan. 29, 1990

Related U.S. Application Data

[62] Division of Ser. No. 368,253, Jun. 19, 1989, Pat. No. 4,916,501.

[30] Foreign Application Priority Data

Jun. 24, 1988 [FR] France .................... 88 08520

[51] Int. Cl.⁵ .................... H01L 21/00; H01L 21/02; H01L 29/78
[52] U.S. Cl. .................... 437/53; 437/2; 437/51; 437/52; 357/23.1; 357/24; 357/30
[58] Field of Search .................... 437/51, 52, 53, 2, 3; 357/24, 24 LR, 23.1, 30; 358/213.19; 377/57, 63, 91

[56] References Cited

U.S. PATENT DOCUMENTS

| | | | |
|---|---|---|---|
| 3,896,485 | 7/1975 | Early | 357/24 |
| 4,373,167 | 2/1983 | Yamada | 357/24 |
| 4,467,341 | 8/1984 | Suzuki | 357/30 |
| 4,498,013 | 2/1985 | Kuroda et al. | 357/24 LR |
| 4,527,182 | 7/1985 | Ishihara et al. | 357/24 LR |
| 4,697,329 | 10/1987 | Boudewijns | 437/53 |
| 4,748,486 | 5/1988 | Miyatake | 357/30 |
| 4,851,890 | 7/1989 | Miyatake | 357/24 |

FOREIGN PATENT DOCUMENTS

| | | |
|---|---|---|
| 0129582 | 2/1981 | Japan . |
| 0163376 | 7/1987 | Japan .................... 437/52 |

OTHER PUBLICATIONS

Baker, K., CCD Array Forms Random-Access Memory, Electronics, Nov. 13, 1975, pp. 138-139.

Primary Examiner—Brian E. Hearn
Assistant Examiner—B. Everhart
Attorney, Agent, or Firm—Roland Plottel

[57] ABSTRACT

The disclosed photosensitive matrix comprises, in a standard way, a P type semiconductor substrate, an N type channel layer separated by narrow insulating zones into a plurality of columns and, on a thin layer of insulating oxide placed on the channel layer, a network of transfer grids extending perpendicularly to the insulating zones, dividing the columns into a large number of "pixels". According to the invention, the matrix has, between the substrate and the channel layer, a weakly doped P type base layer, in which are buried antiblooming diodes consisting of a narrow, strong doped N type drain extending in a direction parallel to the insulation zones. Beneath the drain, there is a strongly doped, P type protective screen. The arrangement gives an optical aperture of the matrix close to unity and a spectral response that is improved towards the red side of the spectrum owing to the thickness of the base layer.

6 Claims, 2 Drawing Sheets

FABRICATION METHOD FOR A CCD FRAME TRANSFER PHOTOSENSITIVE MATRIX WITH VERTICAL ANTI-BLOOMING SYSTEM

This application is a division, of application Ser. No. 07/368,253, filed 6/19/89 now U.S. Pat. No. 4,916,501.

BACKGROUND OF THE INVENTION

1. Field of the Invention

The invention pertains to a frame transfer CCD matrix provided with vertical type anti-blooming means having, on a first type of semiconductor substrate, a second type of channel layer separated by narrow insulating zones into a plurality of columns and surmounted, with an interposed layer of insulating oxide, by a network of transfer gates, extended perpendicularly to the insulating zones and dividing the columns into a large number of "pixels" or elementary picture (or image) elements.

The invention also pertains to a method for the fabrication of a photosensitive matrix such as this.

2. Description of the Prior Art

As is well known, these photosensitive matrices are designed to convert an optical image, projected on the input face of the matrix, into electrical signals formed by a dual sequence of rows and frames. Each frame has a period of accumulation during which the absorbed photons give rise to electron/hole pairs, with one type of charge collecting in elementary cells or pixels while the other type of charge flows through the semiconductor. After the accumulation period, there is a transfer period where the collected charges are sent sequentially, by columns, to conversion capacitors to give rise to a signal voltage. Of course, the transfer period is shorter than the accumulation period.

The cooperation between the insulating zones and the suitably biased transfer grids determines the formation, for each pixel, during the accumulation period, of discrete potential wells separated by walls. The charges collect in these wells which they gradually fill. The filling current or flow is substantially proportionate to the local illumination. During the transfer period, an appropriate modulation of the grid potentials causes the walls of the potential wells to shift towards the columns, towards the conversion capacitors.

It is seen that the charge accumulation capacity of the wells, in conjunction with the frame transfer frequency, determines a range of exploitable illumination levels between a dark level and a blooming level (the latter corresponding to the total filling of the wells) beyond which the charges flow over the walls and fill the adjacent wells.

A standard way to prevent the blooming of zones of the matrix by the overflow of charges from wells into adjacent wells is to have anti-blooming means to drain the extra charges on a barrier level which is close to the blooming level but is lower than it in terms of absolute value. These anti-blooming means are diodes or drains connected to a suitably biased connection so as to be off for a well potential which is higher than the barrier level, and on for a lower potential, in the case where the substrate is of the P type. In the case of a N type substrate, the on and off potentials are respectively lower than and higher than the barrier level.

In the prior art, these anti-blooming means are classified under two types, horizontal or vertical, depending on whether the direction in which the charges flow towards the drains is parallel or perpendicular to the surface of the matrix (which is conventionally considered to stretch along a horizontal plane).

In the horizontal type, as described notably in the documents FR-A-No. 2 529 388 and FR-A-No. 2 529 390, the diodes are placed on the surface of the matrix, adjacent to the pixels. The result thereof is that these diodes, which are optically inactive, occupy a considerable surface of the matrix. The optical aperture of the matrix, or the ratio of the photosensitive surface to the geometrical surface is reduced.

Anti-blooming structures of the vertical type have also been proposed, where the excess charges are discharged through the substrate by means of a buried PN junction formed by a P type recess in an N type substrate. These structures have an optical aperture close to unity. By contrast, they cause a poor spectral response with a loss in sensitivity for the long wavelengths of spectrum, namely red and infra-red. For, the mean distance of absorption of the photons with the formation of electron-hole pairs is relatively great for the low energy photons in silicon, and exceeds the depth of the recesses, this depth being limited, in particular so that the PN junction is close enough to the associated well.

An object of the invention is the making of a photosensitive charge transfer matrix provided with anti-blooming means, and having a wide optical aperture and a good spectral response.

SUMMARY OF THE INVENTION

To this effect, the invention proposes a CCD frame transfer photosensitive matrix; provided with vertical type anti-blooming means with, on a first type of semiconductor substrate, a second type of channel layer separated by narrow insulating zones into a plurality of columns, and surmounted, with the interposition of a thin layer of insulating oxide, by a network of transfer grids that extend perpendicularly to the insulating zones and divide the columns into a large number of pixels, wherein the anti-blooming means are diodes buried in a base layer, in between the substrate and a channel layer, this base layer being of the first type and less doped than the substrate, said diodes being placed in columns parallel to the insulation zones and having a narrow drain of the second type which is strongly doped.

Thus, essentially, we recover the advantage of the vertical type anti-blooming means with an optical aperture close to 1, and the excess charge removal drains do not occupy any place on the surface. The absorption of the photons with the formation of a pair of charges can be done throughout the depth of the base layer and, hence, also at a depth greater than the one at which the drains are buried, so that the spectral response approaches the specific response of the silicon.

Preferably, each diode has a protective screen of the first type, more doped than the base layer, this protective screen being adjacent to the drain on the substrate side. This screen forms a barrier to the direct collection of the charges by the drain during their diffusion from the point where the original photons have given rise to electron/hole pairs up to the accumulation well. Thus, the spectral response is further improved by increasing the optical aperture for the infra-red and red photons.

Although matrices can be made with anti-blooming diodes beneath one in two insulating zones, with each diode draining the two adjacent columns, there will generally be one diode per column of the matrix. Preferably, these diodes will be arranged, in a plane, between the insulating zones, so that the removal is done through the center of the wells.

Preferably, the diodes will be buried at a depth of about half the thickness of the base layer: this corresponds to a compromise among the following factors: a base layer thickness sufficient for the spectral response, an appropriate potential well depth and an efficient connection of the drains to the wells.

In a preferred arrangement, the insulating zones are formed by the first type of semiconductor. For, while these insulating zones may be set up by grids or formed by "LOCOS" or local oxidation zones, it is advantageous to slightly overdope the channel layer of the second type with a first type dopant, for these insulation zones are then photosensitive. This improves the aperture for the photons at the top of the spectrum, which are absorbed near the surface.

Although the working of the matrix in physical terms is the same, whether the charges collected in the wells are electrons or holes, it is preferred that the first type of semiconductor should be of the P type and that the collected charges should thus be electrons which are more mobile than holes.

In another of its aspects, the invention proposes a method for the fabrication of a CCD frame transfer photosensitive matrix provided with vertical type antiblooming means wherein, on a first type of semiconductor substrate, a second type of channel layer is formed in making narrow insulating zones to divide the channel layer into a plurality of columns, a thin layer of insulating oxide is formed on the channel layer and, on this thin layer of oxide, there is placed a network of transfer grids extending perpendicularly to the insulating zones, wherein, on the substrate, there is deposited, by epitaxy, a first part of a first type of base layer less doped than the substrate, a first dopant of a second type is implanted at low energy in the first part of the base layer, in a pattern of narrow columns parallel to the insulating zones provided for, and then, at high energy, a first dopant of a first type is implanted so that, by subsequent diffusion, the second dopant gets diffused more deeply than the first dopant in the first part of the base layer, and a second part of the base layer is epitaxially deposited on the first part, before the channel layer is formed.

BRIEF DESCRIPTION OF THE DRAWINGS

Secondary features of the invention, and its advantages, will emerge from the following description, given by way of example and made with reference to the appended drawings wherein.

DESCRIPTION OF PREFERRED EMBODIMENTS

Figure 1:
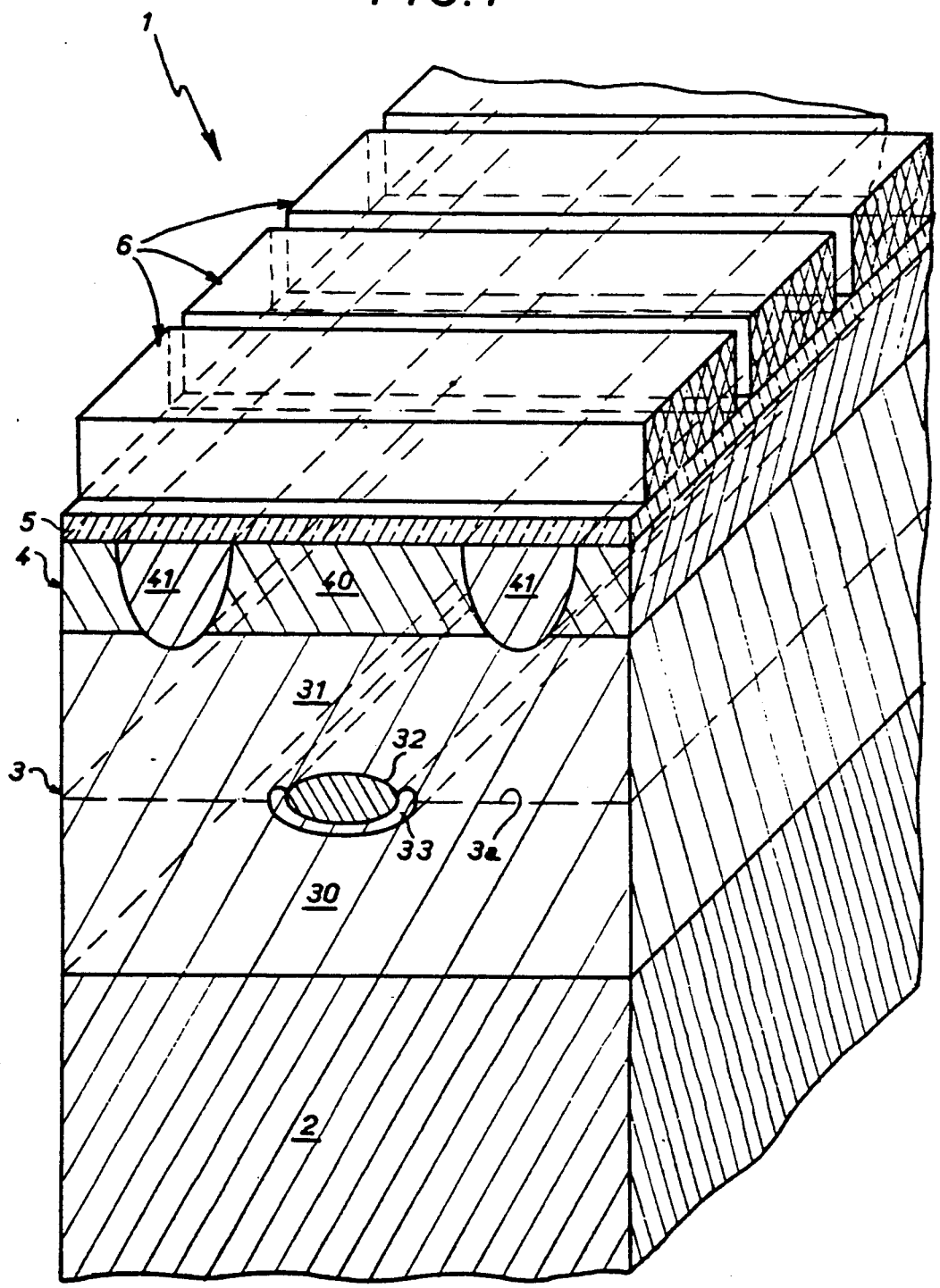
FIG. 1 is a view in perspective of a matrix according to the invention, sectioned along the length of about one pixel.

According to the embodiment, as chosen and represented, the matrix as a whole has a substrate 2 made of P type medium doped silicon. On the substrate 2, there is an epitaxial layer 3, of a P type but weakly doped (of the order of $10^{15}$ atoms per cm$^3$), about 15 $\mu$m thick. This layer 3 is hereinafter called the base layer. On this base layer 3, there is an N type channel layer 4 surmounted by a silicon oxide insulating layer 5.

The channel layer 4 is divided into a plurality of columns 40 by a network of narrow, parallel insulating zones 41, obtained in this case by the diffusion of a P type dopant with a concentration in between those of the substrate and the base layer 3. The term "narrow zones" refers to zones with a width appreciably smaller than that Above the oxide layer 5, there is a network of narrow, equidistant grids 6, perpendicular to the insulating zones and made of polycrystalline silicon. These grids, suitably biased, divide the columns 40 into numerous pixels or image forming elements, in inducing walls of potential in the photosensitive zone formed by the PN junction of the base layer 3 and the channel layer. These walls of potentials intersect those formed by the insulating zones 41 and, together with the latter, they define a matrix of discrete, depleted potential wells in which the carriers in the minority may collect, these carriers in the minority being, in this case, electrons arising out of the creation, by absorption of a photon, of electron/hole pairs in the photosensitive region.

It will be noted that the thickness of this region, essentially formed by the base layer, is enough to absorb the photons in an appreciably uniform way, irrespectively of their wavelengths in the useful spectrum. The blue photons are absorbed practically on a short distance, while the red photons or near infra-red photons penetrate the silicon to an appreciably deeper level.

To form an image signal, after a period of accumulation at frame rate, the accumulated charges are transferred to a plurality of conversion capacitors, this transfer being done in parallel for the plurality of columns and in series for the pixels of one and the same column. This transfer is done by an appropriate periodic modulation of the potentials of the grids to shift, step by step and alternately, the upline and downline walls of each well towards the conversion capacitor of the column. The expressions "upline" and "downline" walls are used with reference to the direction in which the charges are transferred to the conversion capacitor.

The above devices are all standard ones.

It is also standard practice, as recalled above, to provide the image elements, where the charges collect, with anti-blooming devices, formed by diodes, suitably arranged and biased from a voltage source, to come on when the potential created by the accumulated space charge in a well reaches the potential of the peaks of the walls or partitions that demarcate these wells, and to thus drain the excess charges towards the voltage source before they flow over into the adjacent well.

According to the invention, diodes 32 are buried in the base layer 3 at a level 3a in between those of the interfaces with the substrate 2 and with the channel layer 4, in practice, at 5–10 $\mu$m from the substrate 2 and 5 to 10 $\mu$m from the channel layer.

These diodes are formed by a quite strongly doped, N type narrow drain 32 extended in a direction parallel to the insulating zones 41, and at equal distance from them and, hence, substantially vertical to the center of the column that it serves. The drain 32 lies on a screen 33 formed by a strongly doped P type material so that the electrons, coming from the electron/hole pairs formed beneath the level 3a (with a majority of red and infrared photons) and, more especially, beneath the drain 32, can get diffused towards the potential wells located above, without being drawn and absorbed by the drain 32.

As shall be seen in greater detail further below, the base layer 3 is epitaxiated in two stages. In a first stage, a lower semi-layer 30 is made to grow by epitaxy. On this layer 30, the drains 32 and the screens 33 are formed by ion implantation and diffusion and then, in a second stage, an upper semi-layer 31 is epitaxially grown from the level 3a.

The drains 32 are connected to the surface of the matrix, beyond its useful face, by strongly doped N type collector wells.

Figure 2:
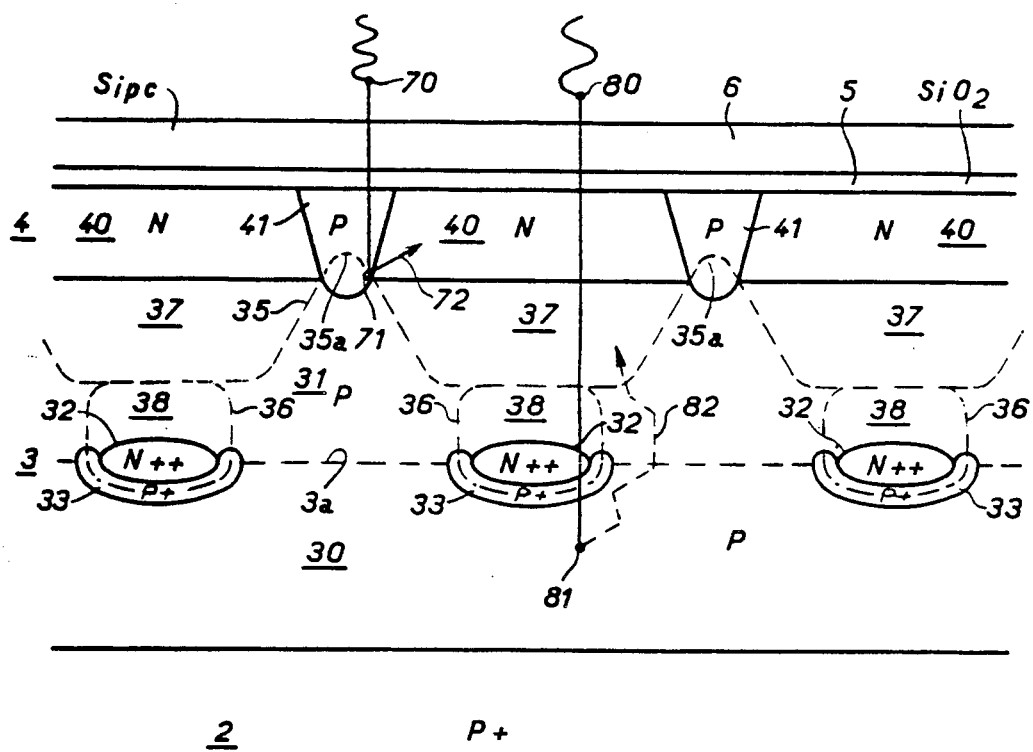
FIG. 2 is a schematic sectional view of a matrix according to the invention, representing the conversion of photons into electron/hole pairs, and the accumulation of charges.

As will be seen more clearly in the sectional view of FIG. 2, the space charge formed by the PN junction beneath the P type base layer and the N type channel layer 4, in cooperation with the P type insulation zones 41, causes the formation of an equipotential 35 which has peaks 35a in the insulating zones and which determines the formation of wells 37 beneath the columns of the channel layer 4. It will be noted that, during the accumulation period, the periodic biasing (spatially periodic case) of grids of the network 6 causes the formation of walls, parallel to the plane of the figure, with a peak configuration analogous to that of the peaks 35a.

Moreover, the biasing of the anti-blooming drains 32, jointly with the drain 32/screen 33 junction, determines the formation of tubular equipotentials 36 which demarcate the collection zone 38.

When a photon with a short wavelength (blue) 70 is absorbed to a depth close to that of the channel layer, at 71 for example, with the formation of an electron/hole pair, the hole is diluted in the mass of the carrier holes, in a majority in P type regions, while the electron 72 gets diffused in the nearby well 37.

Besides, when a photon with a big wavelength 80 (red or infra-red) is absorbed in depth in the base layer 3, for example, at 81, the released electron 82 is diffused in a path determined, on the whole, by the field between the substrate 2 and the equipotential 35, locally altered by the presence of the protective screen 33, the elastic collisions causing random trajectory accidents.

It will be appreciated that, as compared with known horizontal type anti-blooming systems, practically the entire surface of the matrix is photosensitive and no part of the surface is blinded by the presence of an anti-blooming diode. The use of insulating zones obtained by P doping of the N type channel layer, which itself is also photosensitive, is preferable from this point of view to the making of so-called LOCOS type insulating zones, obtained by localized oxidation, or the creation of an insulating zone by the biasing of a grid extended in parallel to the column.

And, as compared with vertical type anti-blooming systems, the spectral response of the semiconductor is substantially preserved, the depth of the base layer 3 being not limited by the depth that can be achieved for P type recesses in an N substrate.

As we have seen, the presence of protective screens 33 enables the substantially total use of the deep sections of the base layer 3.

Besides, the drains 32 could be located beneath the insulating zones 41, and a situation could be envisaged where there is only one drain 32 for two insulating zones 41, said drain 32 then providing from the flow of the charges flow from the potential wells of two adjacent columns 40. However, the arrangement described herein is preferable, with the drain as close as possible to the extreme potential zone.

To make a matrix according to the invention, we take a P type substrate 2 with the level of doping commonly used to make photosensitive matrices (some $10^{18}$ atoms per cm$^3$).

A P type semi-layer 30 with little doping (about $10^{15}$ atoms per cm$^3$) is grown epitaxially, with a thickness of 5 to 10 micrometers. The semi-layer 30 is oxidized to a depth of about 0.4 μm. The oxide layer formed at the locations of the column diodes is removed by photoetching. An ion implantation of antimony is done in a high dose (some $10^{15}$ atoms per cm$^2$) and at low energy (the expressions "high doses" and "low energy" should be understood in the usual sense given to them by those skilled in the art). Then a high energy ion implantation of boron is done in such a way that the boron is located, in the set, beneath the antimony. The subsequent operations for high temperature processing of the matrix will enable diffusion of the dopants and will enable the structure of the diodes 32 with its screen 33 to be obtained.

After implantation, another oxidation operation is done in order to mark the diodes and enable an alignment of the matrix columns, and then all the oxide is removed.

Then, on the surface 3a of the first semi-layer, a second P type semi-layer 31, with the same level of doping as the first layer, is grown epitaxially on a thickness of 5 to 10 micrometers. The thickness of the semi-layer 31 is adjusted according to the voltage to be applied to the anti-blooming drains 32.

After this, on the surface of the base layer 3, the channel layer 4, which is of an N type (with some $10^{16}$ atoms per cm$^3$) is formed. In this channel layer 4, the insulating zones 41, identified with reference to the locations of the drains 32, are formed.

An insulating layer of oxide, of a standard thickness, is grown and the pattern of the network of grids 6, made of polycrystalline silicon, is formed. This network is transparent to the useful spectrum in the thicknesses made.

Then, the connection wells are made in parts of the matrix outside the image forming surface. These connection wells are obtained by diffusion of phosphorous up to the level 3a.

Of course, the scope of the invention is not restricted to the example of a preferred structure that has been described, but covers all alternative embodiments within the framework of the claims.

In particular, the invention has been described on the basis of a P type substrate, a P$^-$ type base layer and an N type channel layer, the accumulated charges being electrons. But it goes without saying that the type of semiconductor could be inverted for all the elements of the matrix and a corresponding physical operation could be obtained. The accumulated charges would then be holes. However, the structure described is still the preferred one, notably because of the qualities of greater mobility of the electrons.

What is claimed is:

1. A method for the fabrication of a CCD frame transfer photosensitive matrix provided with vertical type anti-blooming means wherein, on a semiconductor substrate of a first type, a second type of channel layer is formed in making narrow insulating zones to divide the channel layer into a plurality of columns, a thin layer of insulating oxide is formed on the channel layer and, on this thin layer of oxide, there is placed a network of transfer grids extending perpendicularly to the insulating zones wherein, on the substrate, there is deposited, by epitaxy, a first part of a first type of base layer less doped than the substrate, a first dopant of a second type is implanted, at low energy, in the first part of the base layer, in a pattern of narrow columns parallel to the insulating zones provided for, and then, at high energy, a first dopant of a first type is implanted so that, by subsequent diffusion, the second dopant gets diffused more deeply than the first dopant in the first part of the base layer, and a second part of the base layer is epitaxially deposited on the first part, before the channel layer is formed.

2. A method according to claim 1 wherein said epitaxial grown first part of said base layer (30) is in the range of 5 to 10 micrometers thick, and said epitaxially grown second part of said base layer (31) is in the range of 5 to 10 micrometers thick, said thickness of said second part being adjusted according to the voltage to be applied to the anti-blooming drains (32).

3. A method according to claim 2 wherein said low and high energy implants in said pattern of narrow columns (31, 32) is with said columns positioned below and between insulating zones (41).

4. A method according to claim 2 wherein said low and high energy implants in said pattern of narrow columns (31, 32) is with said columns positioned below every other insulating zone (41).

5. A method according to claim 2 wherein said substrate is formed with said first type of approximately $10^{18}$ atoms/cm$^2$, said base layer is epitaxially deposited with a first type of approximately $10^{15}$ atoms/cm$^2$, and said channel layer is formed with said second type of approximately $10^{16}$ atoms/cm$^2$.

6. A method according to claim 5 wherein said low energy implant dopant of said second type is antimony, and said high energy implanted dopant of a first type of boran.

* * * * *